US012799623B2

(12) United States Patent
Kim et al.

(10) Patent No.: US 12,799,623 B2
(45) Date of Patent: Nov. 17, 2026

(54) METHOD FOR FABRICATING ENHANCEMENT MODE TRANSISTOR MATERIAL, ENHANCEMENT MODE TRANSISTOR MATERIAL FABRICATED THEREBY, ENHANCEMENT MODE TRANSISTOR INCLUDING THE SAME, AND AMPLIFYING CIRCUIT INCLUDING THE SAME

(71) Applicant: RESEARCH & BUSINESS FOUNDATION SUNGKYUNKWAN UNIVERSITY, Suwon-si (KR)

(72) Inventors: Tae Il Kim, Pyeongtaek-si (KR); Young Jin Jo, Gwangmyeong-si (KR); Seung Hwan Choy, Daejeon (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 511 days.

(21) Appl. No.: 18/454,447

(22) Filed: Aug. 23, 2023

(65) Prior Publication Data

US 2024/0068120 A1 Feb. 29, 2024

(30) Foreign Application Priority Data

Aug. 24, 2022 (KR) ........................ 10-2022-0106073

(51) Int. Cl.

| | |
|---|---|
| ***C30B 7/14*** | (2006.01) |
| ***C30B 29/58*** | (2006.01) |
| ***H10K 10/46*** | (2023.01) |
| ***H10K 71/40*** | (2023.01) |
| ***H10K 85/10*** | (2023.01) |
| *H10K 19/10* | (2023.01) |

(52) U.S. Cl.

CPC ................ *C30B 7/14* (2013.01); *C30B 29/58* (2013.01); *H10K 10/484* (2023.02); *H10K 71/40* (2023.02); *H10K 85/10* (2023.02); *H10K 19/10* (2023.02)

(58) Field of Classification Search

CPC .......... C30B 7/14; C30B 29/58; H10K 85/10; H10K 71/40; H10K 10/484; H10K 19/10

See application file for complete search history.

(56) References Cited

FOREIGN PATENT DOCUMENTS

| | | | |
|---|---|---|---|
| KR | 10-2021-0110509 | A | 9/2021 |
| KR | 10-2346118 | B1 | 1/2022 |

(Continued)

OTHER PUBLICATIONS

Casado et al. "Injectable PEDOT:PSS/cholinium ionic liquid mixed conducting materials for electrocardiogram recordings" J. Mater. Chem. C 2022, 10, 15186. Sep. 2022.*

(Continued)

*Primary Examiner* — Robert S Walters, Jr.

(74) *Attorney, Agent, or Firm* — LEX IP MEISTER, PLLC

(57) ABSTRACT

Disclosed are a method for fabricating an enhancement mode transistor material, an enhancement mode transistor material fabricated thereby, an enhancement mode transistor including the same, and an amplifying circuit including the same. The method for fabricating an enhancement mode transistor material includes: a first step of mixing and reacting a solution including a conductive polymer and an ionic reactant including a negative ion that enables deprotonation of the conductive polymer.

6 Claims, 8 Drawing Sheets

(56) References Cited

FOREIGN PATENT DOCUMENTS

| | | | | |
|---|---|---|---|---|
| WO | WO-2012158125 A1 | * | 11/2012 | ........... H10K 71/441 |
| WO | WO2020/174842 A1 | | 9/2020 | |

OTHER PUBLICATIONS

Jo et al. "Fibrillary gelation and dedoping of PEDOT:PSS fibers for interdigitated organic electrochemical transistors and circuits" npj flexible electronics 6, May 31, 2022.*

Im, Soeun, et al. "A Study on Improving Electrical Conductivity for Conducting Polymers and their Applications to Transparent Electrodes." Applied Chemistry for Engineering 26.6 (2015): 640-647., (Abstract in English, 8 pages in Korean).

Keene, Scott T., et al. "Enhancement-Mode Pedot: Pss Organic Electrochemical Transistors Using Molecular De-Doping." Advanced Materials 32.19 (2020): 2000270., (8 pages).

* cited by examiner

METHOD FOR FABRICATING ENHANCEMENT MODE TRANSISTOR MATERIAL, ENHANCEMENT MODE TRANSISTOR MATERIAL FABRICATED THEREBY, ENHANCEMENT MODE TRANSISTOR INCLUDING THE SAME, AND AMPLIFYING CIRCUIT INCLUDING THE SAME

CROSS-REFERENCE TO RELATED APPLICATION

This application claims the benefit under 35 USC § 119(a) of Korean Patent Application Number 10-2022-0106073, filed on Aug. 24, 2022, the entire disclosure of which is incorporated herein by reference for all purposes.

BACKGROUND OF THE INVENTION

1. Field of the Invention

The present invention relates to a method for fabricating an enhancement mode transistor material, an enhancement mode transistor material fabricated thereby, an enhancement mode transistor including the same, and an amplifying circuit including the same.

2. Description of the Related Art

A bio-integrated electronic device refers to a device capable of communicating electronic information with a target cell or a target organ in a living body. Such a bio-integrated electronic device may be fabricated in an ultra-thin or probe shape so as to be attached onto or implanted into a surface of the target cell or the target organ. Most bio-integrated electronic devices have focused on being fabricated to be flexible and stretchable by using a conventional organic or inorganic material in order to maintain performance against a motion of the living body.

Due to intrinsic properties of cells, tissues, and organs, the bio-integrated electronic device has to be integrated in an aqueous medium. An organic electrochemical transistor (OECT) refers to an electronic device in which a current is adjusted by exchanging a specific ion or a biomolecule in a living body. The OECT has to operate at low voltages to reduce damage to biological systems, and is required to amplify a biosignal with a high signal-to-noise ratio. In order to control characteristics of the OECT, physical or chemical properties of a material have to be changed, so that various additives or crosslinkers may be included. However, it is difficult to satisfy both improvement in electrical performance and biocompatibility.

Meanwhile, a conventional OECT is driven under a positive voltage. When the positive voltage is applied, oxygen may react with a channel layer so that characteristics of a conductive polymer may deteriorate. In order to prevent such performance deterioration, development of an OECT driven at a negative voltage is required.

SUMMARY OF THE INVENTION

One object of the present invention is to provide a method for fabricating an enhancement mode transistor material having improved electrical performance and excellent biocompatibility.

Another object of the present invention is to provide an enhancement mode transistor material fabricated by the method for fabricating the enhancement mode transistor material.

Still another object of the present invention is to provide an enhancement mode transistor including the enhancement mode transistor material.

Yet another object of the present invention is to provide an amplifying circuit including the enhancement mode transistor.

According to one aspect of the present invention, there is provided a method for fabricating an enhancement mode transistor material, the method including: a first step of mixing and reacting a solution including a conductive polymer and an ionic reactant including a negative ion that enables deprotonation of the conductive polymer.

According to one embodiment, the conductive polymer may include a sulfonate functional group, the ionic reactant may include a positive ion that performs a Hofmeister interaction with the sulfonate functional group, the method for fabricating an enhancement mode transistor material further comprises a second step mixing and reacting an amphiphilic reactant with a reaction product of the first step.

According to one embodiment, the amphiphilic reactant may allow the conductive polymer to form a crystal including a spherulite or a lamella structure.

According to one embodiment, the negative ion of the ionic reactant may include bicarbonate.

According to one embodiment, the positive ion of the ionic reactant may include choline.

According to one embodiment, the amphiphilic reactant may include dipalmitoylphosphatidylcholine (DPPC).

According to one embodiment, the method for fabricating an enhancement mode transistor material further comprises a third step of applying a reaction product of the second step onto a substrate, and performing a heat treatment.

According to one embodiment, the heat treatment may be performed by performing annealing at a temperature of 140 to 160° C.

According to another aspect of the present invention, there is provided an enhancement mode transistor material, the material includes a crystallized conductive polymer.

According to one embodiment, the conductive polymer may be a crystal containing a spherulite and an amphiphilic material formed in a lamella structure in a spherical shell region of the spherulite.

According to one embodiment, when a negative voltage is applied to the enhancement mode transistor material, conductivity of the enhancement mode transistor material may be increased.

According to one embodiment, the crystal may contain choline

According to one embodiment, the amphiphilic material may include dipalmitoylphosphatidylcholine (DPPC).

According to one embodiment, a root mean square of the crystal may be 2 to 4 nm.

According to still another aspect of the present invention, there is provided an enhancement mode transistor including: a film-shaped channel including the enhancement mode transistor material; a source electrode formed on one side of the channel; a drain electrode formed on an opposite side of the channel while being spaced apart from the source electrode; and a gate electrode formed on one surface of the channel.

According to yet another aspect of the present invention, there is provided an amplifying circuit including: a first transistor; and a second transistor, wherein a drain electrode of the first transistor is connected to a gate electrode of the second transistor, and each of the first transistor and the second transistor is the enhancement mode transistor.

According to an embodiment of the present invention, the method for fabricating the enhancement mode transistor material may induce self-assembly of a molecular structure so that electrical characteristics can be implemented.

According to an embodiment of the present invention, the enhancement mode transistor material can fabricate an element capable of adjusting electrical characteristics with a negative voltage.

According to an embodiment of the present invention, the enhancement mode transistor can adjust electrical characteristics with a negative voltage.

According to the present invention, the amplifying circuit can be used in applications requiring biocompatibility.

DETAILED DESCRIPTION OF THE INVENTION

Figure 1:
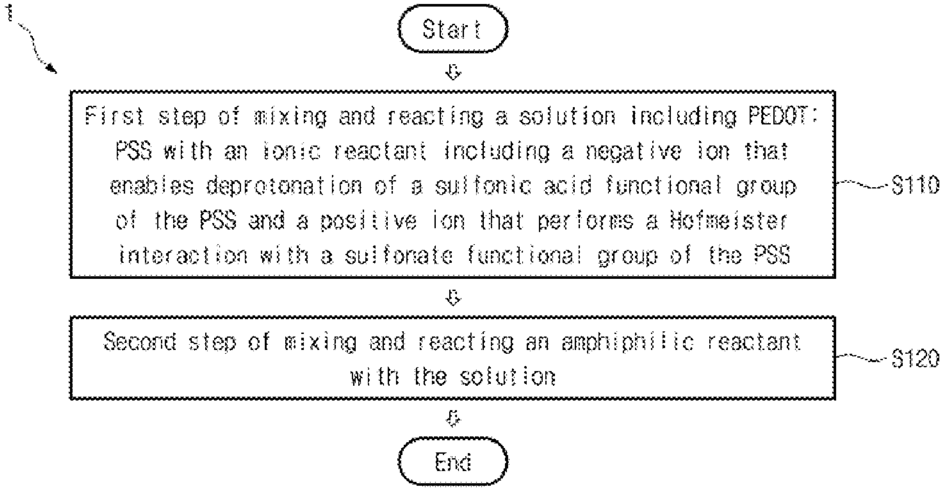
FIG. 1 is a flowchart showing a method for fabricating an enhancement mode transistor material according to an embodiment of the present invention.

Hereinafter, an embodiment of the present invention will be described in detail with reference to the accompanying drawings. Since various changes can be made to the present invention, and the present invention may have various forms, specific embodiments will be illustrated in the drawings and described in detail through the detailed description. This, however, is by no means to restrict the present invention to a specific disclosed form, and the present invention shall be construed as including all modifications, equivalents, and substitutes within the idea and technical scope of the present invention. Like reference numerals have been used for like elements throughout the descriptions of the drawings. In the accompanying drawings, dimensions of structures have been enlarged from actual dimensions for clarity of the present invention.

Terms used herein are used only to describe specific embodiments, and are not intended to limit the present invention. Unless the context clearly indicates otherwise, an expression in a singular form includes a meaning of a plural form. As used herein, the term such as "including" or "having" is intended to designate the presence of features, numbers, steps, operations, elements, or combinations thereof described in the present disclosure, and shall not be construed to preclude any possibility of the presence or addition of one or more other features, numbers, steps, operations, elements, or combinations thereof.

Unless defined otherwise, all terms used herein, including technical or scientific terms, have the same meaning as those commonly understood by a person having ordinary skill in the art to which the present invention pertains. Any terms as those defined in generally used dictionaries shall be interpreted as having the meanings consistent with the contextual meanings in the relevant field of art, and shall not be interpreted as having idealistic or excessively formalistic meanings unless explicitly defined in the present disclosure.

FIG. 1 is a flowchart showing a method for fabricating an enhancement mode transistor material according to an embodiment of the present invention.

Referring to FIG. 1, according to an embodiment of the present invention, a method for fabricating an enhancement mode transistor material may include: a first step S110 of mixing and reacting a solution including a conductive polymer and an ionic reactant including a negative ion that enables deprotonation of the conductive polymer.

the conductive polymer includes a sulfonate functional group, the ionic reactant includes a positive ion that performs a Hofmeister interaction with the sulfonate functional group.

The method for fabricating an enhancement mode transistor material may further include a second step mixing and reacting an amphiphilic reactant with a reaction product of the first step.

In the present specification, the conductive polymer may be at least one compound selected from the group consisting of polyaniline-based polymers, polypyrrole-based polymers, and polythiophene-based polymers, and preferably, polythiophene-based polymers, (3,4-ethylene dioxythiophene) (PEDOT). Hereinafter, it will be described that PEDOT:PSS is used as a conductive polymer, but is not limited thereto.

Figure 2:
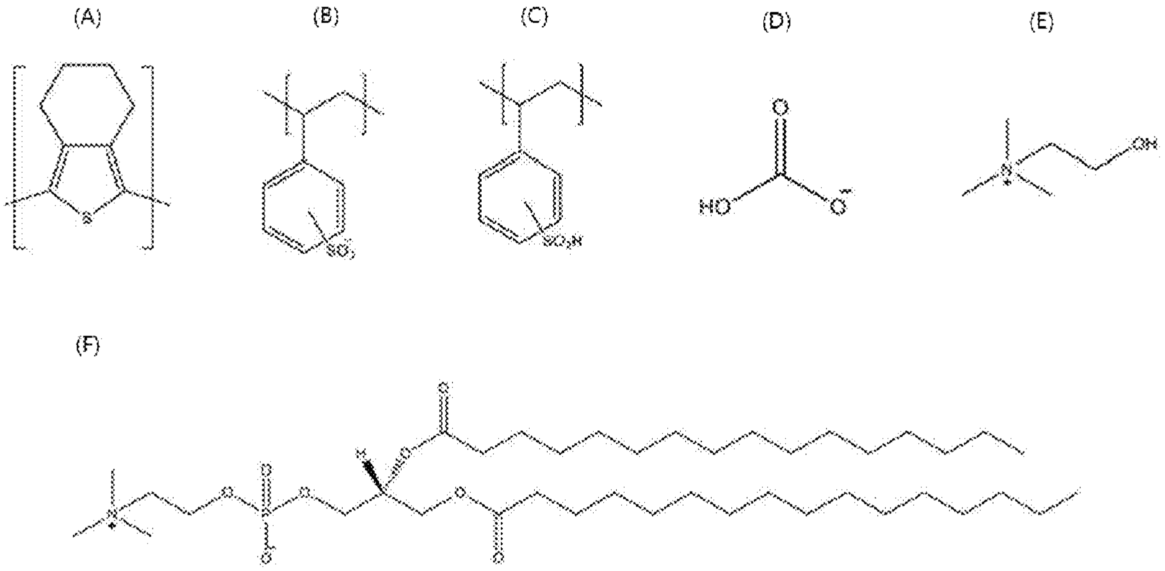
FIG. 2 shows chemical formulas of compounds that may be used in the method for fabricating the enhancement mode transistor material according to the embodiment of the present invention.

According to the context of the present disclosure, the PEDOT may represent poly(3,4-ethylenedioxythiophene) and represent a compound having a chemical formula of FIG. 2A.

According to the context of the present disclosure, the PSS may represent poly(styrenesulfonate) and represent a compound having a chemical formula of FIG. 2B, and PSSH may represent a compound having a chemical formula of FIG. 2C. However, the PSS may collectively represent the compound having the chemical formula of FIG. 2B as well as the compound having the chemical formula of FIG. 2C. In particular, when the PSS and sulfonate are used together, the PSS may represent the compound having the chemical formula of FIG. 2B, and when the PSS and sulfonic acid are used together, the PSS may represent the compound having the chemical formula of FIG. 2C.

The conductive polymer having a sulfonate functional group is a monomer of a group consisting of a polyaniline-based polymer, a polypyrrole-based polymer, and a polythiophene-based polymer, and may mean a polymer having a sulfonic acid or sulfonate functional group.

Referring continuously to FIG. 1, the first step S110 may be a step of mixing and reacting a solution including PEDOT:PSS with an ionic reactant. According to the context of the present disclosure, "ionic" may represent a property of ionizing a part, for example, a significantly great portion, for example, substantially all under a specific condition, for example, in a solution, for example, in an aqueous solution. The ionic reactant may be an ionic compound, in which derived ions may interact with another compound.

According to the context of the present disclosure, "reaction" may collectively represent all interactions between compounds. For example, "reaction" may collectively represent all bonds in which atoms or molecules form a bonding force having a significantly high level by sharing electrons, donating electrons, or accepting electrons, bonds caused by electrostatic attraction between ionic substances, and interactions between molecules formed by biased distribution of electrons or temporary dipoles.

The negative ion may enable deprotonation of a sulfonic acid functional group of the PSS. According to the context of the present disclosure, "deprotonation" may represent a reaction of removing a proton from a compound having the proton, or a process in which the reaction occurs, or a state in which the reaction has occurred, or a function capable of allowing the reaction to occur. According to one embodiment, the negative ion may react with a proton of the sulfonic acid functional group of the compound having the chemical formula of FIG. 2C to derive the compound having the chemical formula of FIG. 2B. A type of the negative ion is not particularly limited as long as the negative ion performs the above function. According to one embodiment, the negative ion of the ionic reactant may include bicarbonate. According to one embodiment, the negative ion of the ionic reactant may include a compound having a chemical formula of FIG. 2D. When the negative ion is bicarbonate, a product resulting from deprotonation may be water and carbon dioxide.

The positive ion may perform a Hofmeister interaction with a sulfonate functional group of the PSS. According to the context of the present disclosure, "Hofmeister interaction" may represent an interaction of an ion with a protein, especially an interaction in a way that affects solubility of a protein in a solution. According to one embodiment, the positive ion may perform a Hofmeister interaction with the sulfonate functional group of the compound having the chemical formula of FIG. 2B. A type of the positive ion is not particularly limited as long as the positive ion performs the above function. According to one embodiment, the positive ion of the ionic reactant may include choline. The choline may be a bio-derived positive ion, which may exhibit high biocompatibility when used in a material applied to a living body. According to one embodiment, the positive ion of the ionic reactant may include a compound having a chemical formula of FIG. 2E.

As a result of the first step S110, the negative ion may be dedope the PEDOT:PSS through the deprotonation of the PSS, and the positive ion may maintain a state in which the Hofmeister interaction with the sulfonate group of the dedoped PSS is performed.

When the negative ion and the positive ion perform the above functions, according to one embodiment, in the first step, the PEDOT:PSS and the ionic reactant may be mixed and reacted at a molar ratio of about 3:1 to 5:1. For example, in the first step, the PEDOT:PSS and the ionic reactant may be mixed and reacted at a molar ratio of about 4:1. Due to an appropriate content of the ionic reactant, the negative ion and the positive ion may perform the above functions at an appropriate level.

Referring continuously to FIG. 1, the second step S120 may be a step of mixing and reacting an amphiphilic reactant with the solution. According to the context of the present disclosure, "amphiphilic" may represent a property of having affinity for both hydrophilic and hydrophobic solvents due to inclusion of both hydrophilic and hydrophobic functional groups when a solvent is classified into hydrophilic and hydrophobic solvents. In the second step S120, the amphiphilic reactant may allow reactants included in the reaction solution to form a specific arrangement due to amphiphilicity within the reaction solution. According to one embodiment, the amphiphilic reactant may allow the PEDOT and the PSS to form a crystal including a spherulite. According to the context of the present disclosure, a spherulite may represent a spherical crystal or semi-crystal region including a polymer.

A type of the amphiphilic reactant is not particularly limited as long as the amphiphilic reactant performs the above function. According to one embodiment, the amphiphilic reactant may include dipalmitoylphosphatidylcholine (DPPC). According to one embodiment, the amphiphilic reactant may include a compound having a chemical formula of FIG. 2F.

When the amphiphilic reactant performs the above function, according to one embodiment, in the second step, the amphiphilic reactant may be mixed and reacted with a conductive polymer at a molar ratio of about 1:3 to 1:5. For example, in the second step, the amphiphilic reactant may be mixed and reacted with the conductive polymer at a molar ratio of about 1:4. Due to an appropriate content of the amphiphilic reactant, the amphiphilic reactant may perform the above function at an appropriate level.

Figure 3:
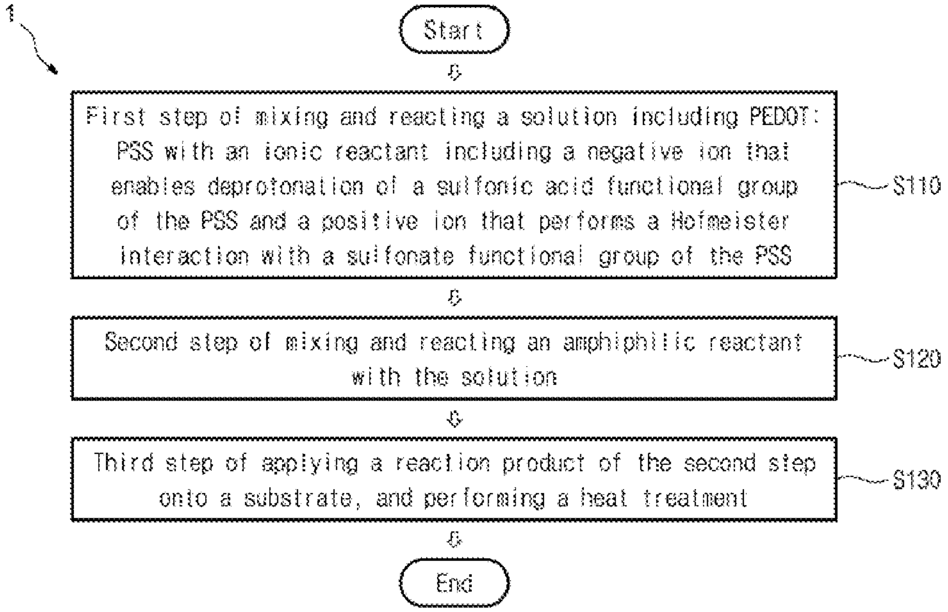
FIG. 3 is a flowchart showing a method for fabricating an enhancement mode transistor material according to another embodiment of the present invention.

FIG. 3 is a flowchart showing a method for fabricating an enhancement mode transistor material according to another embodiment of the present invention.

Referring to FIG. 3, according to one embodiment, the method for fabricating the enhancement mode transistor material may further include a third step S130 of applying a reaction product of the second step onto a substrate, and performing a heat treatment. The heat treatment step S130 may be a step of fabricating a material having a film shape or a film-like shape by applying the solution, which has been subjected to the reactions in the first step S110 and the second step S120, onto the substrate, and performing the heat treatment. In the solution that has been subjected to the reactions in the first step S110 and the second step S120, a heat treatment temperature and a heat treatment time may be determined according to physical and chemical properties determined by a content of each component, a reaction time, and the like. According to one embodiment, the heat treatment may be performed by performing annealing at a temperature of about 140 to 160° C. According to one embodiment, the heat treatment may be performed by performing annealing at a temperature of about 150° C. According to one embodiment, the heat treatment may be performed by performing annealing for about 40 to 80 minutes. According to one embodiment, the heat treatment may be performed by performing annealing for about 60 minutes. According to one embodiment, the heat treatment may be performed by performing annealing at a temperature of about 140 to 160° C. for about 40 to 80 minutes. According to one embodiment, the heat treatment may be performed by performing annealing at a temperature of about 150° C. for about 60 minutes.

As described above, according to the embodiment of the present invention, the method for fabricating the enhancement mode transistor material may induce self-assembly of a molecular structure so that electrical characteristics may be implemented.

In another aspect, according to an embodiment of the present invention, an enhancement mode transistor material may include: a crystallized conductive polymer.

The conductive polymer may be a crystal containing a spherulite and an amphiphilic material formed in a lamella structure in a spherical shell region of the spherulite.

The description of the method for fabricating the enhancement mode transistor material according to the embodiment of the present invention set forth above may be applied in an identical or similar manner to an identical or similar configuration in the description of the enhancement mode transistor material according to the embodiment of the present invention. Therefore, according to one embodiment, the positive ionic material may include choline. According to one embodiment, the positive ion of the ionic reactant may include the compound having the chemical formula of FIG. 2E. In addition, according to one embodiment, the amphiphilic material may include dipalmitoylphosphatidylcholine (DPPC). According to one embodiment, the amphiphilic reactant may include the compound having the chemical formula of FIG. 2F.

On the other hand, as described above, the enhancement mode transistor material according to the embodiment of the present invention is the conductive polymer in which crystallization has progressed. The conductive polymer is the conductive polymer is a crystal containing a spherulite and an amphiphilic material formed in a lamella structure in a spherical shell region of the spherulite.

Meanwhile, as described above, according to the embodiment of the present invention, the enhancement mode transistor material may include a crystal including a conductive polymer of a spherulite, and a PSS formed in a lamella structure in a spherical shell region of the spherulite. The structure as described above will become more apparent in the following description of the embodiment of the present invention.

A size and a structure of the crystal may be derived according to a type, a composition, and a content of each of the components that are mixed and reacted. According to one embodiment, a root mean square of the crystal may be about 2 to 4 nm. For example, the root mean square of the crystal may be about 3 nm.

The material described above may have electrical characteristics due to the above structure of the components. According to one embodiment, when a negative voltage is applied to the enhancement mode transistor material, conductivity of the enhancement mode transistor material may be increased. Without limiting the scope of the present invention, a choline molecule that performs a Hofmeister interaction with sulfonate of the PSS in the enhancement mode transistor material may be peeled off as Hofmeister interaction is weakened when the negative voltage is applied to the enhancement mode transistor material, so that a doping state of the PSS with respect to the PEDOT may be temporarily restored, and electrical conductivity may be obtained.

As described above, according to the embodiment of the present invention, the enhancement mode transistor material may fabricate an element capable of adjusting electrical characteristics with a negative voltage.

Figure 4:
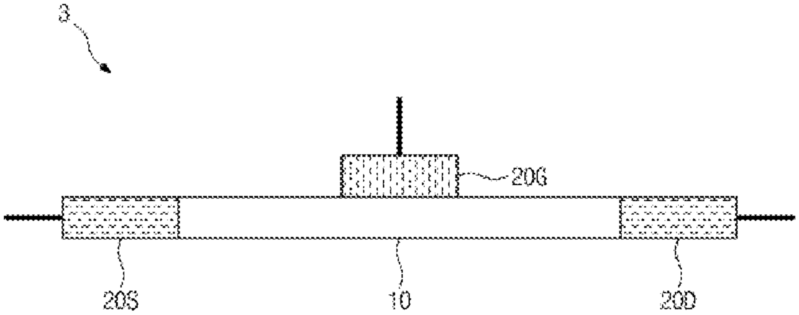
FIG. 4 is a view schematically showing an enhancement mode transistor according to one embodiment of the present invention.

FIG. 4 is a view schematically showing an enhancement mode transistor according to one embodiment of the present invention.

Referring to FIG. 4, according to an embodiment of the present invention, an enhancement mode transistor 3 may include: a film-shaped channel 10; a source electrode 20S formed on one side of the channel 10; a drain electrode 20D formed on an opposite side of the channel 10 while being spaced apart from the source electrode 20S; and a gate electrode 20G formed on one surface of the channel 10.

The description of the enhancement mode transistor material according to the embodiment of the present invention set forth above may be applied in an identical or similar manner to an identical or similar configuration in the description of the enhancement mode transistor according to the embodiment of the present invention. In addition, the channel 10 may include the enhancement mode transistor material described above. Therefore, according to one embodiment, when a negative voltage is applied to the channel 10 of the enhancement mode transistor 3, conductivity of the channel 10 may be increased.

As described above, according to the embodiment of the present invention, the enhancement mode transistor may adjust electrical characteristics with a negative voltage.

Figure 5:
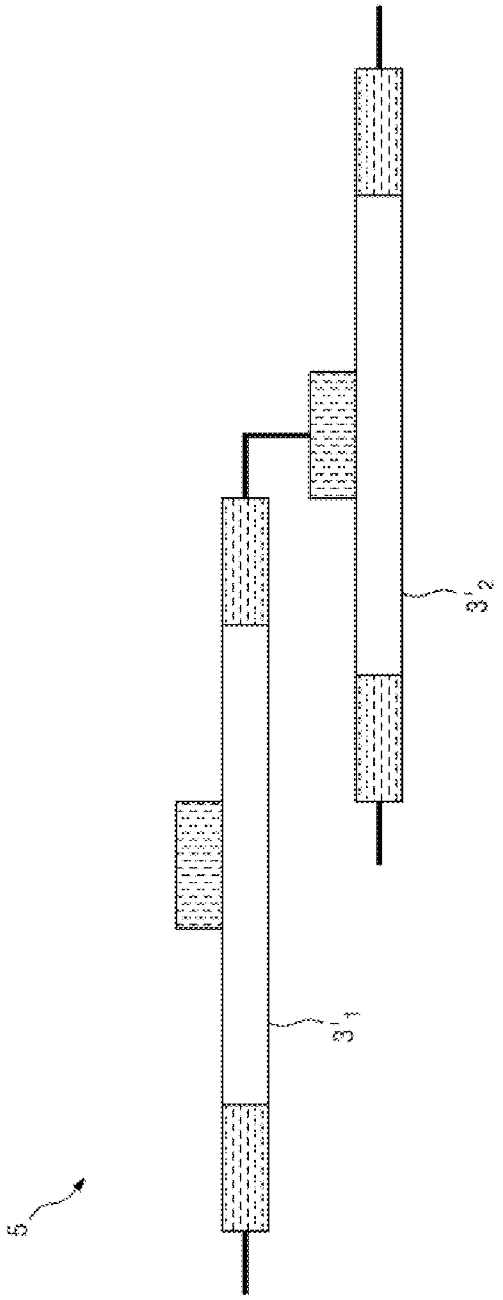
FIG. 5 is a view schematically showing an amplifying circuit according to one embodiment of the present invention.

FIG. 5 is a view schematically showing an amplifying circuit according to one embodiment of the present invention.

Referring to FIG. 5, according to an embodiment of the present invention, an amplifying circuit 5 may include: a first transistor $\mathbf{3'}_1$; and a second transistor $\mathbf{3'}_2$. Referring continuously to FIG. 5, according to one embodiment, a drain electrode of the first transistor $\mathbf{3'}_1$ may be connected to a gate electrode of the second transistor $\mathbf{3'}_2$. The description of the enhancement mode transistor material according to the embodiment of the present invention set forth above may be applied in an identical or similar manner to an identical or similar configuration in the description of the amplifying circuit according to the embodiment of the present invention. According to one embodiment, each of the first transistor $\mathbf{3'}_1$ and the second transistor $\mathbf{3'}_2$ may be the enhancement mode transistor according to the embodiment of the present invention described above.

The amplifying circuit 5 according to the embodiment of the present invention has been shown to have a minimal configuration including both transistors capable of achieving amplification performance, which does not limit the scope of the present invention. Therefore, the amplifying circuit 5 according to the embodiment of the present invention may be included, the addition of other members, for example, additional circuits, conducting wires, electronic devices, and electrodes, may not be excluded, and an object including the amplifying circuit 5 may fall within the scope of the present invention. For example, the present invention discloses an electrocardiogram device including the amplifying circuit 5.

As described above, according to the present invention, the amplifying circuit may be used in applications requiring biocompatibility.

Hereinafter, an embodiment of the present invention will be described in detail. However, the embodiment that will be described below is merely some implementation forms of the present invention, so that the scope of the present invention is not limited to the following embodiment.

Fabrication of Enhancement Mode Transistor Material

A solution in which PEDOT:PSS (Clevios PH1000, Heraeus Holding GmbH, Germany) is dispersed was stirred while adding choline bicarbonate (Sigma aldrich, Saint Louis, MO, USA) dropwise. The choline bicarbonate and the PEDOT:PSS were mixed with each other at a molar ratio of 1:4.

After a reaction is performed, a reaction product was washed with deionized water three times.

After the washed product is dissolved in deionized water at 11 to 13% (w/w), DPPC (Sigma aldrich, Saint Louis, MO, USA) was added. The DPPC and the PEDOT:PSS were mixed with each other at a molar ratio of 1:4. The dispersion solution was subjected to sonication for 20 minutes.

Accordingly, an enhancement mode transistor material according to an embodiment of the present invention was fabricated.

Fabrication of Enhancement Mode Transistor

After spin-coating the bio-electronic material on a glass substrate at 2,000 rpm, a heat treatment was performed at 150° C. for 1 hour to prepare a channel layer having a film shape. The channel layer was dry-etched through a reactive ion etching device that provides a gas flow of $O_2$:$CF_4$=1:3. Au/Cr having a thickness of 50 nm/5 nm was formed on the channel layer through photolithography to form a gate electrode, a source electrode, and a drain electrode.

Accordingly, an enhancement mode transistor according to an embodiment of the present invention was fabricated.

Proposal of Fabrication Principle of Enhancement Mode Transistor Material

Figure 6:
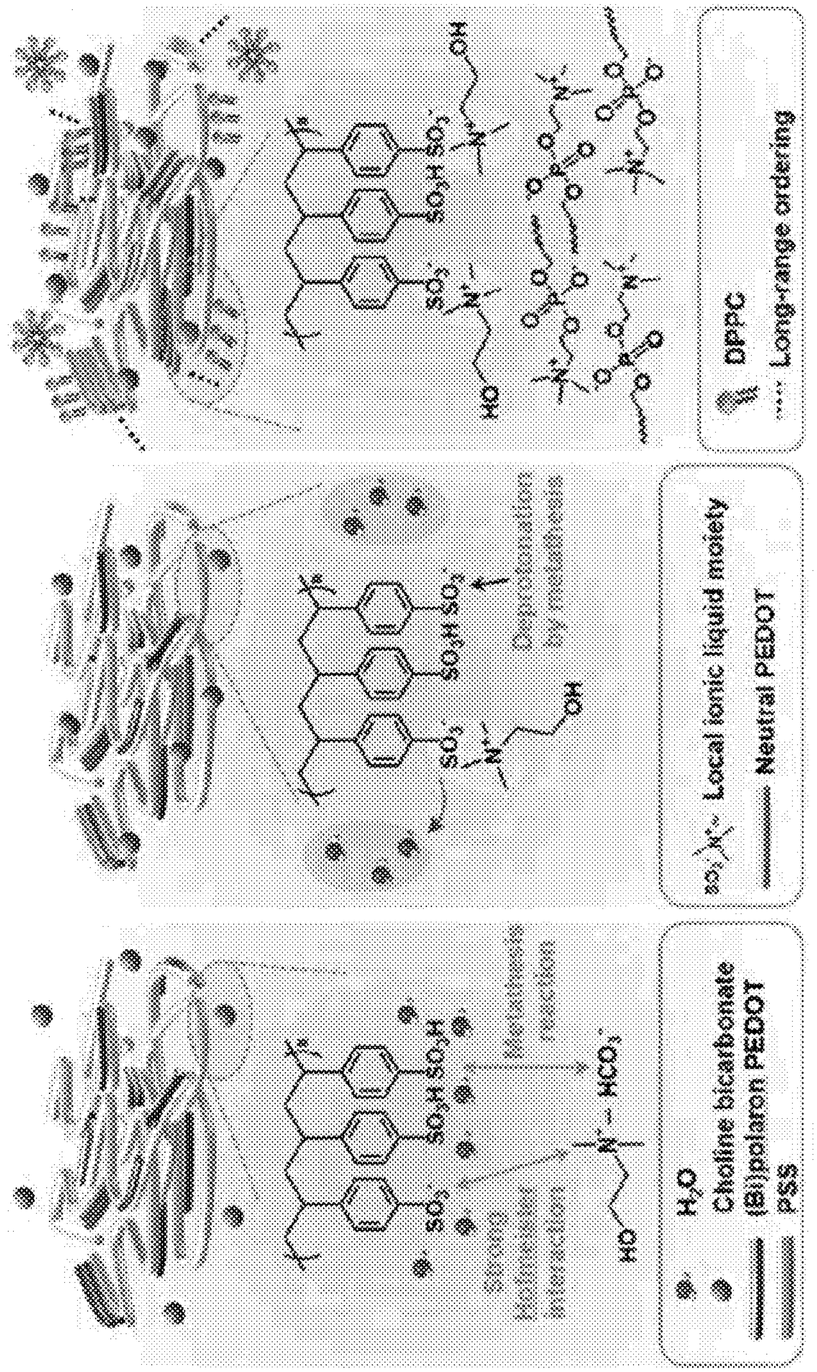
FIGS. 6 to 10 are views for describing experimental results according to an embodiment of the present invention.

Without limiting the scope of the present invention, FIG. 6 proposes a process of fabricating an enhancement mode transistor material according to an embodiment of the present invention at a molecular level. According to the present invention, as shown in FIG. 6, a new compound may be formed through a reaction between a conductive polymer dispersed in an aqueous solution and a bio-derived ionic liquid. According to the present invention, choline was used as quaternary ammonium having a very strong bonding force between ions in order to efficiently adjust properties of PEDOT:PSS. The above chemical reaction may occur due to a Hofmeister interaction between a positive ion and a negative ion. After the reaction is completed, DPPC, which is an amphiphilic material, was dispersed in the aqueous solution to induce alignment of an organic semiconductor in the aqueous solution.

When choline bicarbonate is reacted with the PEDOT:PSS solution, a hydrogen ion bonded to the PSS and bicarbonate may react with each other so as to be decomposed into water and carbon dioxide, and removed. Through the above reaction, a choline ion and a sulfonate ion may form an ionic bond, and when the prepared solution is spin-coated to form a thin film and subjected to a heat treatment at 120° C., an unpaired electron of an oxygen molecule of a hydroxyl functional group of the choline ion may move to a thiophene ring of a PEDOT molecule through a thermal transfer phenomenon so as to form a PEDOT chain having neutral and polaron.

Analysis of Reaction Mechanism

Figure 7:
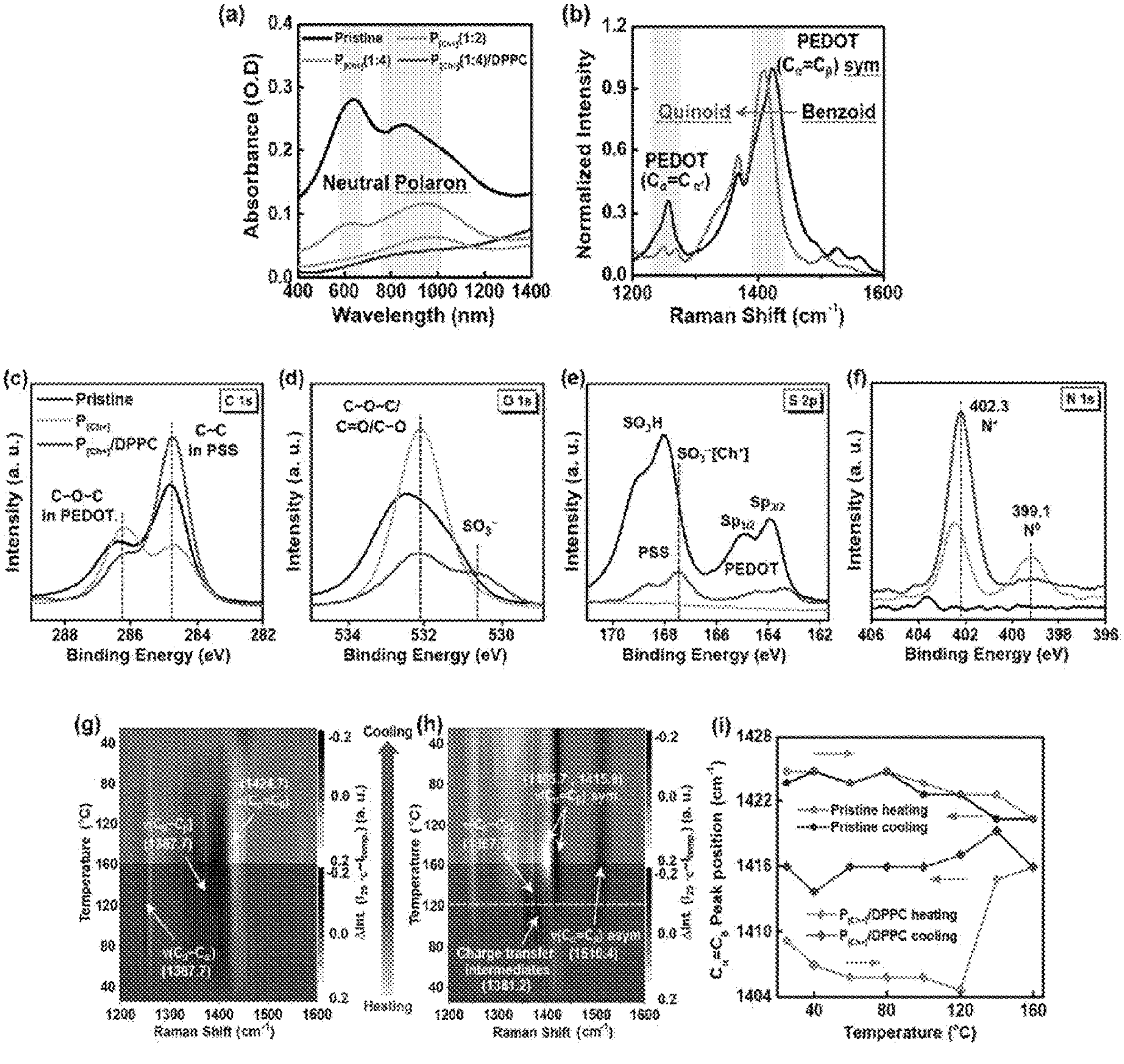

Without limiting the scope of the present invention, a reaction mechanism was analyzed and shown in FIG. 7. It was found in FIG. 7A that the corresponding chain is formed according to a reaction ratio through UV-vis-NIR spectroscopy measurement, and it was found that a structure of the PEDOT chain is changed from the form of benzoid (coil type) to quinoid (extended coil) through a shift of a peak in a Raman spectroscopy measurement result of FIG. 7B. It was found in FIGS. 7C to 7F that the PEDOT:PSS, the choline, and the DPPC interact with each other at a molecular level through X-ray photoelectron spectroscopy for C 1s, O 1s, S 2p, and N 1s atoms, and rearrangement of molecules occurs when the DPPC is added after reacting with the choline bicarbonate (P[Ch+]). FIGS. 7G to 7I are results of observing a molecular change occurring inside the molecule during the heat treatment at 120° C. through in-situ Raman spectroscopy. In this case, a process of raising a temperature from a room temperature to 160° C. and lowering the temperature to the room temperature was performed to confirm a peak shift. As a result, pristine PEDOT:PSS in FIG. 7G was not significantly changed according to the temperature, whereas when a choline bicarbonate reaction of FIG. 7H and the DPPC are added, it was found that structural stability is reduced at 120° C. or more, and a quinoid structure of the PEDOT returns to a benzoid structure.

Analysis of Crystal Structure

Figure 8:
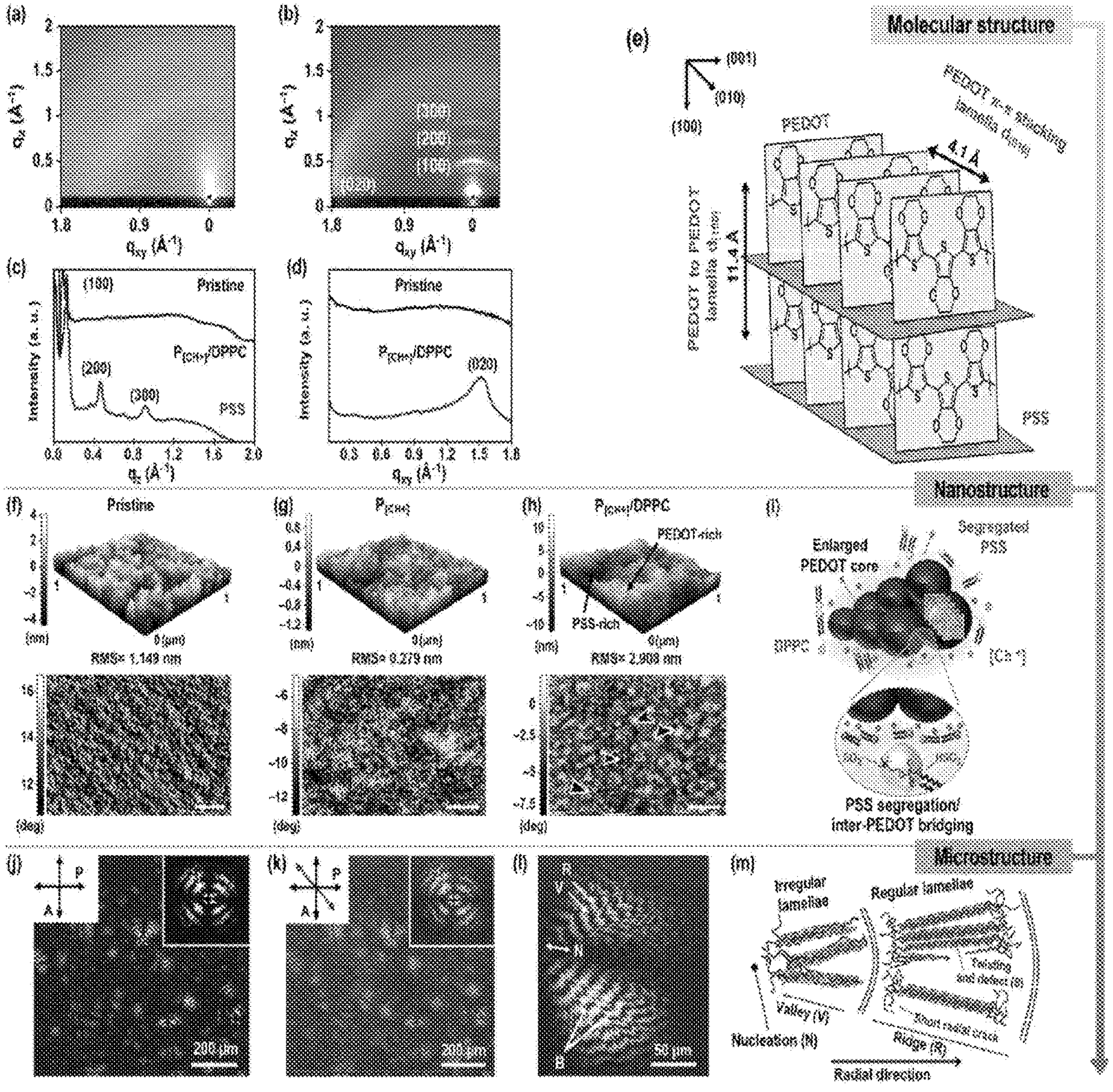

Without limiting the scope of the present invention, a crystal structure was analyzed and shown in FIG. 8. In a case of a thin film layer formed of a general PEDOT:PSS aqueous solution, as shown in FIG. 8A, when grazing-incidence wide-angle x-ray scattering (GIWAXS) measurement is performed, alignment of a molecular structure in a specific direction was not observed. However, in a case of the thin film fainted through the present invention, molecules were aligned in a specific direction as shown in FIGS. 8B to 8D, and a relevant schematic diagram is shown in FIG. 8E. FIGS. 8F to 8H are atomic force microscopy (AFM) measurement results of a general PEDOT:PSS thin film layer, a thin film layer obtained by only the reaction between the PEDOT:PSS and the choline bicarbonate, and a thin film layer obtained through a reaction among the PEDOT:PSS, the choline bicarbonate, and a phospholipid material, in which distinct crystal grains were identified in FIG. 8H, unlike FIGS. 8F and 8G. As shown in FIG. 8I, it was found that the PEDOT:PSS molecules are aligned to have a crystal structure based on self-assembly characteristics of phospholipids. FIG. 8J is a result of observing the thin film layer formed through introduction of an ionic biomaterial with a polarizing microscope. When a lambda plate is applied, it was found that the PEDOT:PSS molecules are aligned in a specific direction as shown in FIGS. 8K and 8L (parallel alignment with the lambda plate: blue, and perpendicular alignment with the lambda plate: yellow). This is because, as shown in FIG. 8M, a lamella structure was formed in a radial direction based on a point where nucleation occurs during a heat treatment process after the thin film is formed.

Analysis of Characteristics of Enhancement Mode Transistor

Figure 9:
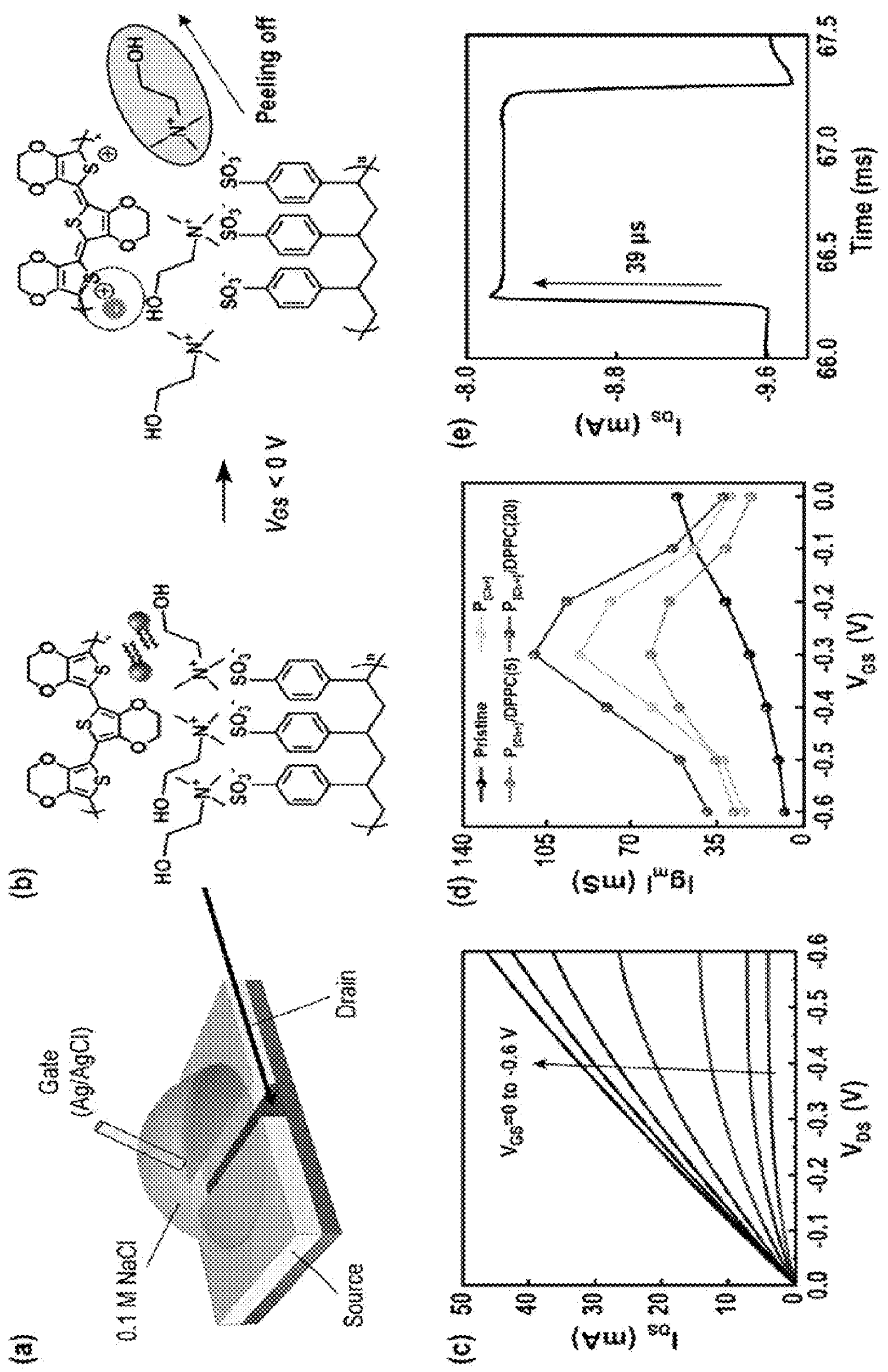

The enhancement mode transistor material according to the embodiment of the present invention may be applied to an enhancement mode transistor having a structure as shown in FIG. 9A. Unlike a conventional PEDOT:PSS-based transistor driven by a positive voltage, an element fabricated according to the present invention may be driven by a negative voltage. As shown in FIG. 9B, due to the negative voltage, a negative ion inside an electrolyte may penetrate into a semiconductor layer, or may temporarily peel off a choline ion bonded with the PSS, so that a current flowing through the channel layer may be increased as shown in FIGS. 9C and 9D. In addition, FIG. 9E is a result of measuring a reaction speed of the transistor, in which the measured reaction speed was up to 39 μs, which is faster than hundreds of μs to several ms of a conventional organic electrochemical transistor.

Amplifying Circuit and Electrocardiogram Measurement

Figure 10:
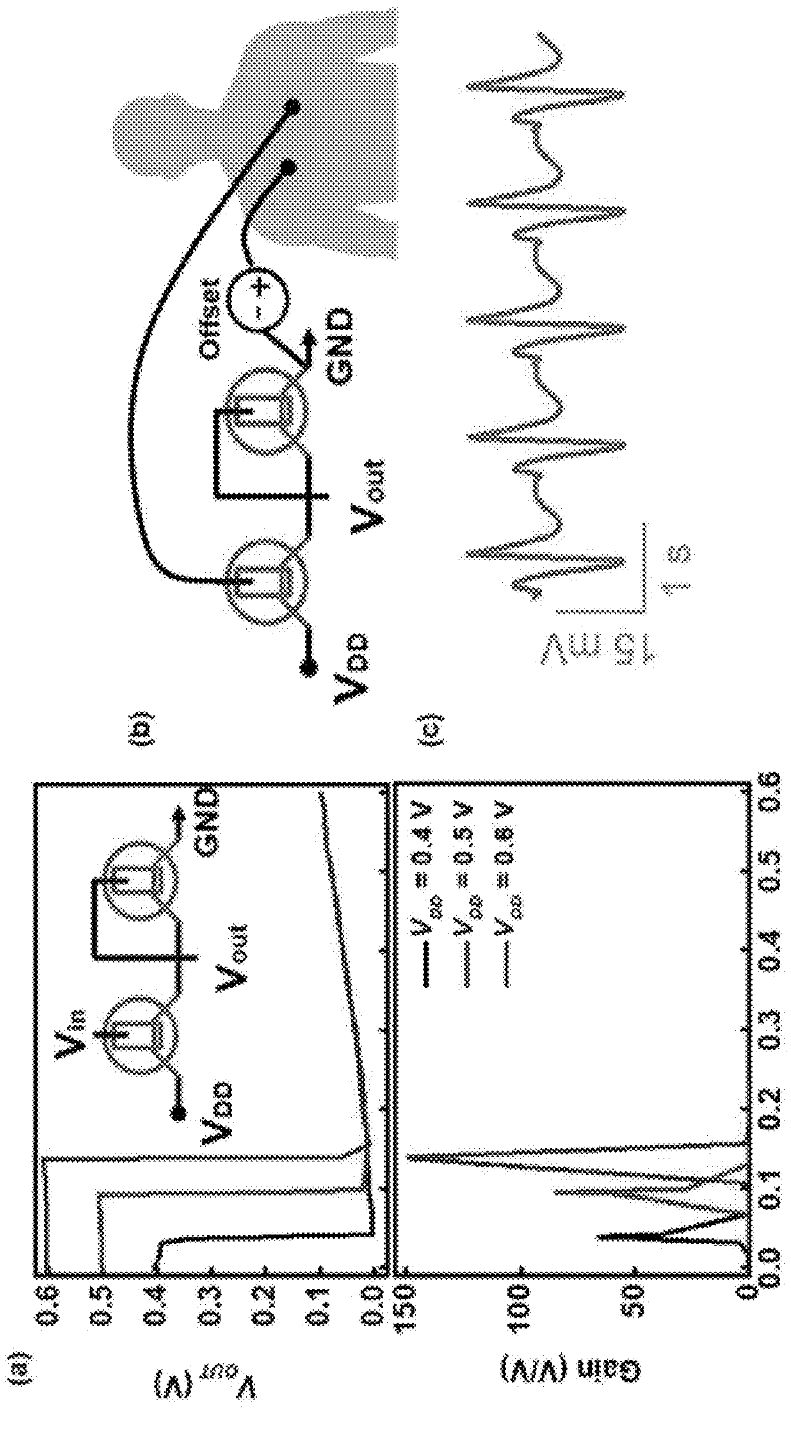

The enhancement mode transistor according to the embodiment of the present invention may be used to fabricate an amplifying circuit (amplifier) as shown in FIG. 10. FIG. 10A is a measurement result of an inverter circuit fabricated by connecting two transistors in series, in which an output voltage was inverted based on a specific value of an input voltage. Such an inversion characteristic may be utilized to use the amplifying circuit as an amplifying element when an electrocardiogram is measured as shown in FIG. 10B, and a measurement result thereof is shown in FIG. 10C.

Although exemplary embodiments of the present invention have been described above, it will be understand by those skilled in the art that various modifications and changes can be made to the present invention without departing from the idea and scope of the present invention as set forth in the appended claims.

What is claimed is:

1. A method for fabricating an enhancement mode transistor material, the method including:

a first step of mixing and reacting a solution including a conductive polymer and an ionic reactant including a negative ion that enables deprotonation of the conductive polymer; and a second step mixing and reacting an amphiphilic reactant with a reaction product of the first step, wherein the conductive polymer includes a sulfonate functional group, wherein the ionic reactant includes a positive ion that performs a Hofmeister interaction with the sulfonate functional group, and wherein the amphiphilic reactant includes dipalmitoylphosphatidylcholine (DPPC).

2. The method of claim 1, wherein the amphiphilic reactant allows the conductive polymer to form a crystal including a spherulite or a lamella structure.

3. The method of claim 1, wherein the negative ion of the ionic reactant includes bicarbonate.

4. The method of claim 1, wherein the positive ion of the ionic reactant includes choline.

5. The method of claim 1, further comprising a third step of applying a reaction product of the second step onto a substrate, and performing a heat treatment.

6. The method of claim 5, wherein the heat treatment is performed by performing annealing at a temperature of 140 to 160° C.

* * * * *